United States Patent
Rodder et al.

(10) Patent No.: US 8,927,373 B2
(45) Date of Patent: Jan. 6, 2015

(54) METHODS OF FABRICATING NON-PLANAR TRANSISTORS INCLUDING CURRENT ENHANCING STRUCTURES

(71) Applicant: Samsung Electronics Co., Ltd., Suwon-si (KR)

(72) Inventors: Mark S. Rodder, University Park, TX (US); Kang-ill Seo, Loudonville, NY (US)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 13/801,001

(22) Filed: Mar. 13, 2013

(65) Prior Publication Data

US 2014/0273397 A1    Sep. 18, 2014

(51) Int. Cl.
*H01L 21/336* (2006.01)
*H01L 21/76* (2006.01)

(52) U.S. Cl.
CPC ..................................... *H01L 21/76* (2013.01)
USPC .......................................... 438/294; 438/400

(58) Field of Classification Search
USPC ................................................. 438/400, 294
See application file for complete search history.

(56) References Cited

U.S. PATENT DOCUMENTS

| | | |
|---|---|---|
| 2005/0077553 A1 | 4/2005 | Kim et al. |
| 2007/0145487 A1 | 6/2007 | Kavalieros et al. |
| 2007/0278585 A1 | 12/2007 | Dyer et al. |
| 2008/0079094 A1 | 4/2008 | Jin et al. |
| 2008/0142881 A1 | 6/2008 | Mikasa |
| 2009/0176340 A1 | 7/2009 | Kim |
| 2011/0068407 A1 | 3/2011 | Yeh et al. |
| 2011/0147811 A1 | 6/2011 | Kavalieros et al. |
| 2012/0012932 A1 | 1/2012 | Perng et al. |
| 2012/0032265 A1 | 2/2012 | Simonelli et al. |
| 2013/0241003 A1* | 9/2013 | Lin et al. ........................ 257/392 |
| 2014/0070328 A1* | 3/2014 | Goto et al. .................... 257/401 |

FOREIGN PATENT DOCUMENTS

| | | |
|---|---|---|
| JP | 22283381 | 12/2010 |
| KR | 1020100001198 | 1/2010 |

* cited by examiner

*Primary Examiner* — Bradley K Smith

(74) *Attorney, Agent, or Firm* — Myers Bigel Sibley & Sajovec, P.A.

(57) ABSTRACT

Methods of fabricating non-planar transistors including current enhancing structures are provided. The methods may include forming first and second fin structures directly adjacent each other overlying a substrate including an isolation layer. The methods may further include forming a spacer on the isolation layer including first and second recesses exposing upper surfaces of the first and second fin structures respectively. The spacer may cover an upper surface of the isolation layer between the first and second recesses. The methods may also include forming first and second current enhancing structures contacting the first and second fin structures, respectively, in the first and second recesses.

20 Claims, 16 Drawing Sheets

METHODS OF FABRICATING NON-PLANAR TRANSISTORS INCLUDING CURRENT ENHANCING STRUCTURES

FIELD

The present disclosure generally relates to the field of electronics, and more particularly semiconductor devices.

BACKGROUND

Non-planar transistors, including fin transistors, may be applied as one of the scaling technologies for increasing density of integrated circuit devices. Additionally, stressor materials on source-drain regions may be applied to increase the current carried by the high density integrated circuit devices. Stressor materials may be epitaxial layers having merged or unmerged structures.

SUMMARY

A method of forming a semiconductor structure in a fin-FET may include forming first and second fin structures directly adjacent each other overlying a substrate including an isolation layer. The first and second fin structures may contact the isolation layer. The method may further include forming a spacer including first and second recesses exposing upper surfaces of the first and second fin structures respectively on the isolation layer and the spacer may cover an upper surface of the isolation layer between the first and second recesses. The method may also include forming first and second current enhancing structures contacting the first and second fin structures, respectively, in the first and second recesses.

In some embodiments, the method may also include removing portions of the side walls of the spacer to increases widths of the first and second recesses to greater than those of the first and second fin structures respectively.

In some embodiments, forming the first and second fin structures may include forming first and second preliminary fin structures directly adjacent each other overlying the substrate. The first and second preliminary fin structures may contact the isolation layer. Forming the first and second fin structures may further include forming a spacer layer on the isolation layer and on side walls of the first and second preliminary fin structures to fill a gap therebetween and removing upper portions of the first and second preliminary fin structures to form the first and second fin structure respectively and to expose side walls of the spacer in the first and second recesses.

According to some embodiments, moreover the method may include partially etching the spacer layer before forming the first and second recesses.

In some embodiments, forming the first and second fin structures may include forming the first and second fin structures at least partially buried in the isolation layer.

According to some embodiments, forming the first and second fin structures may include forming the first and second fin structures contacting an upper surface of the isolation layer. The substrate may include a Silicon On Insulator (SOI) and the isolation layer may include a buried insulator of the SOI.

In some embodiments, the method may further include forming a gate structure crossing over and contacting the first and second preliminary fin structures and forming the spacer on side walls of the gate structure while forming the spacer on the isolation layer.

In some embodiments, the spacer may completely cover the upper surface of the isolation layer between the first and second recesses.

According to some embodiments, forming the first and second current enhancing structures may include forming the first and second current enhancing structures including a material having a resistivity less than a resistivity of a material included in the first and second fin structures.

In some embodiments, forming the first and second current enhancing structures may include forming the first and second current enhancing structures including a stressor material, which contact the first and second fin structures.

In some embodiments, forming the first and second current enhancing structures including the stressor material may include epitaxially growing the stressor material in the first and second recesses while being constrained by the spacer.

In some embodiments, forming the first and second current enhancing structures may further include forming a hardmask material on the stressor material.

According to some embodiments, forming the hard mask material may include epitaxially growing the hard mask material while changing a concentration of a constituent included in the stressor material. The hard mask layer may contact an uppermost surface of the stressor material.

According to some embodiments, forming the first and second current enhancing structures including the stressor material may include forming the stressor material having a lattice constant greater than a lattice constant of a material included in the first and second fin structures.

In some embodiments, the method may also include forming an interlayer insulating layer on the spacer and the first and second current enhancing structures, forming a contact pattern on the interlayer insulating layer and etching the interlayer insulating layer using the contact pattern until reaching the first and second current enhancing structures.

According to some embodiments, etching the interlayer insulating layer may include etching the interlayer insulating layer using the spacer and the first and second current enhancing structures as an etch stop layer.

According to some embodiments, the method may further include forming an insulating layer on the spacer covering the upper surface of the isolation layer between the first and second recesses before forming the interlayer insulating layer. Etching the interlayer insulating layer may include etching the interlayer insulating layer using the insulating layer and the first and second current enhancing structures as an etch stop layer.

In some embodiments, the method may include removing the spacer to expose side walls of the first and second current enhancing structures after etching the interlayer insulating layer and forming a contact on the first and second enhancing structures contacting the side walls of the first and second enhancing structures.

In some embodiments, the method may further include forming an insulating layer on the spacer covering the upper surface of the isolation layer between the first and second recesses before forming the interlayer insulating layer, removing the insulating layer to expose side walls of the first and second current enhancing structures after etching the interlayer insulating layer and forming a contact on the first and second current enhancing structures contacting the side walls of the first and second enhancing structures.

In some embodiments, forming the spacer may include forming the spacer including nitride.

According to some embodiments, the interlayer insulating layer may have an etch selectivity with respect to the spacer of about 10:1.

According to some embodiments, forming the first and second current enhancing structures may include forming the first and second current enhancing structures having a width constant or gradually decreasing from lower surfaces to upper surfaces of the first and second current enhancing structures.

A method of forming a semiconductor structure in a fin-FET may include forming an isolation layer on a substrate and forming first and second preliminary fin structures directly adjacent each other on a substrate. The first and second preliminary fin structures may be at least partially buried in the isolation layer. The method may further include forming a spacer on the isolation layer and on side walls of the first and second preliminary fin structures filling a gap between the first and second preliminary fin structures and removing upper portions of the first and second preliminary fin structures respectively to forming first and second fin structures. Removing the upper portions of the first and second preliminary fin structures may form first and second recesses exposing side walls of the spacer. The method may also include forming first and second current enhancing structures contacting the first and second fin structures respectively in the first and second recesses, forming an interlayer insulating layer on the first and second current enhancing structures and on the spacer, forming a contact pattern on the interlayer insulating layer, etching the interlayer insulating layer using the contact pattern until reaching the first and second current enhancing structures, exposing side walls of the first and second current enhancing structures and forming a contact on the first and second current enhancing structures contacting the side walls of the first and second current enhancing structures.

A method of forming a semiconductor structure in a fin-FET may include forming an isolation layer on a substrate and forming first and second fin structures directly adjacent each other on the substrate. The first and second fin structures may be at least partially buried in the isolation layer. The method may further include forming first and second stressors contacting upper surfaces of the first and second fin structures respectively and forming an etch stop layer filling a gap between the first and second stressors. The etch stop layer may contact side walls of the first and second stressors and exposes upper surfaces of the first and second stressors. The method may also include forming an interlayer insulating layer on the first and second stressors and the etch stop layer, forming a contact pattern on the interlayer insulating layer, etching the interlayer insulating layer using the contact pattern until reaching the first and second stressors then removing the etch stop layer to expose the side walls of the first and second stressors and forming a contact on the first and second stressors contacting the side walls of the first and second stressors.

DETAILED DESCRIPTION

Figure 1:
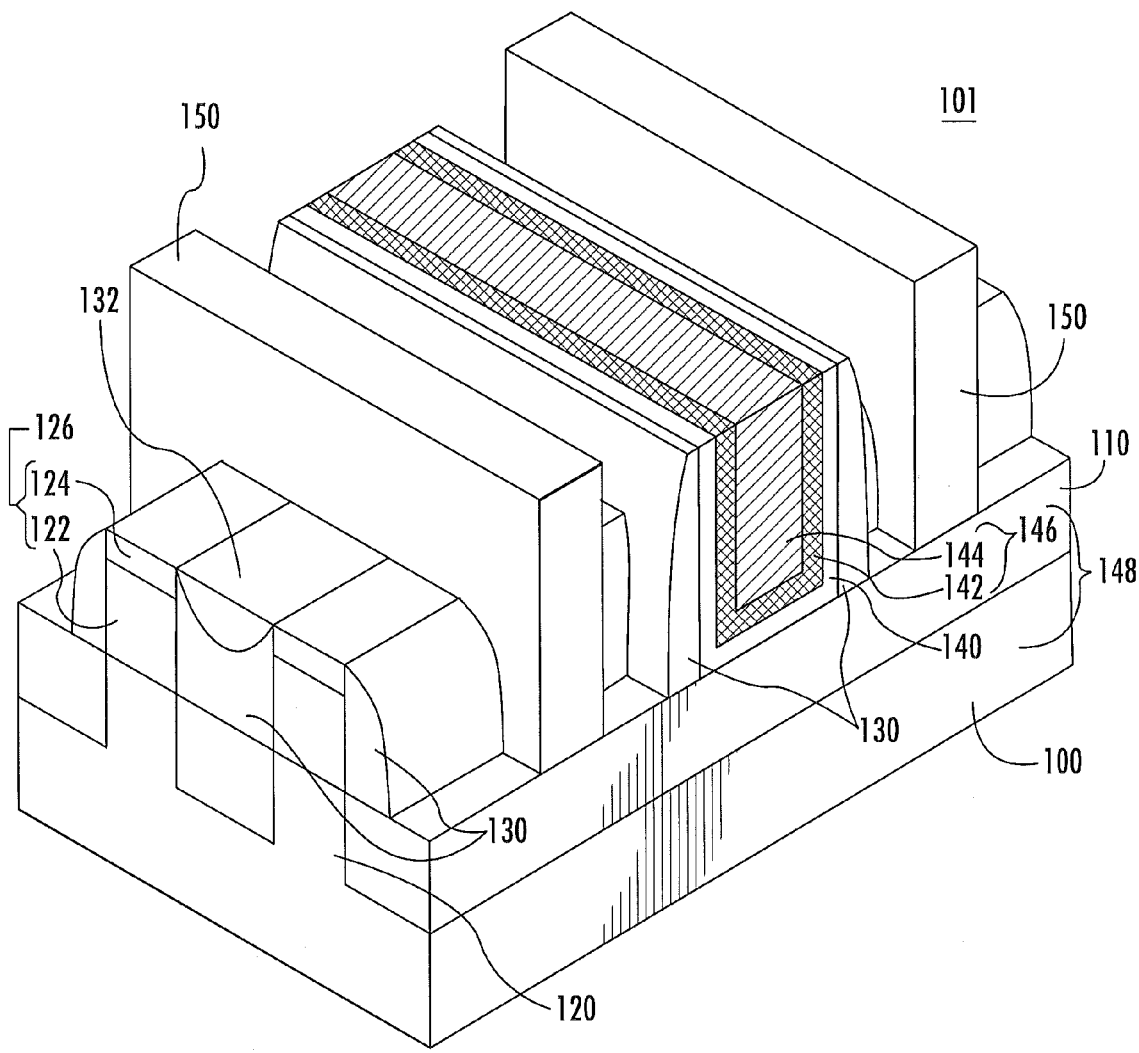
FIGS. 1 through 3 are perspective views of fin transistors according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 2:
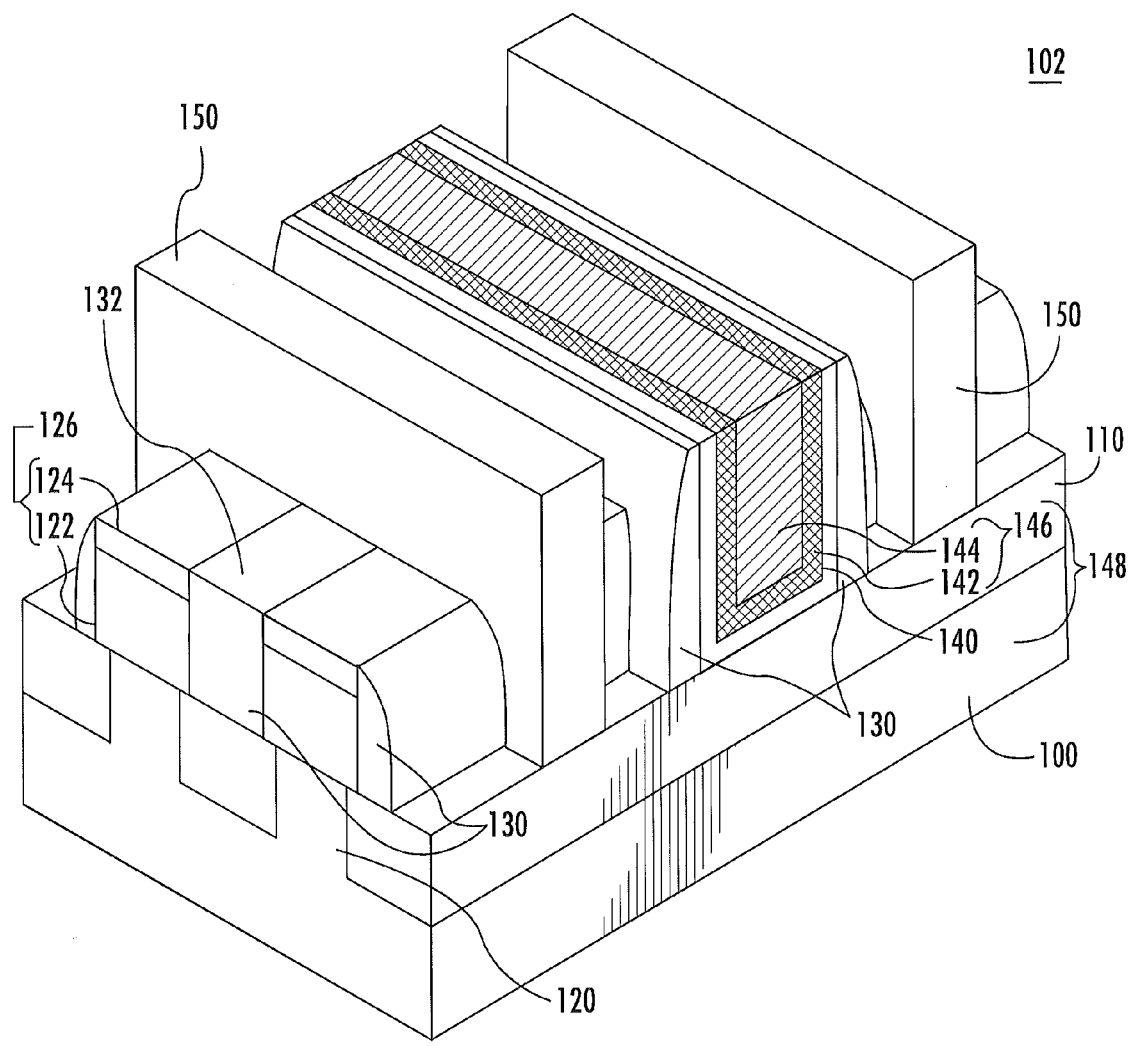
Figure 3:
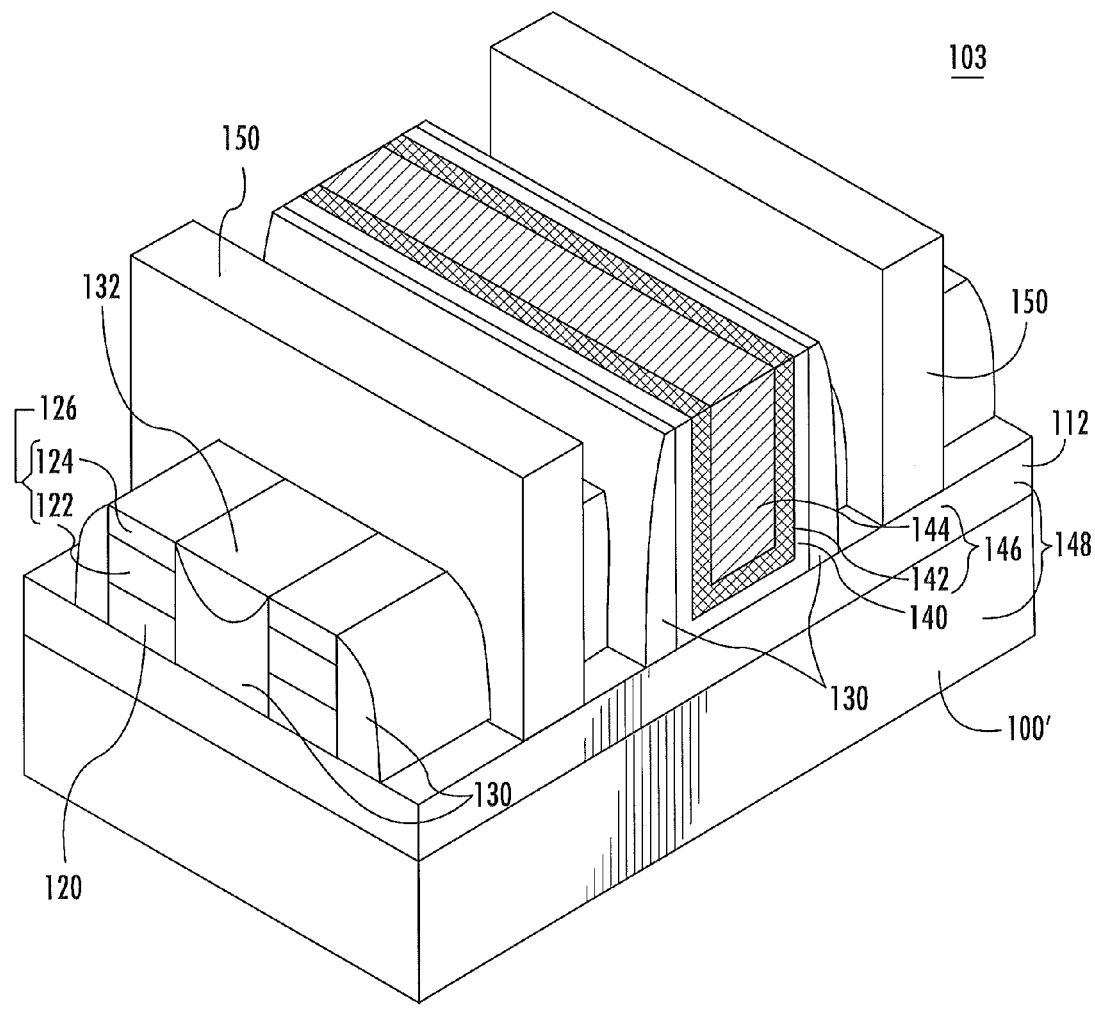

FIGS. 1 through 3 are perspective views of transistors 101, 102, 103 according to some embodiments of the present inventive concept. The transistors 101, 102, 103 may be non-planar transistors having non-planar channels and may be multi-gate transistors such as, for example, a tri-gate transistor. The transistors 101, 102, 103 may be included in an SRAM.

Referring to FIGS. 1 and 2, an isolation layer 110 may be formed on a substrate 100. First and second fin structures 120, which are directly adjacent each other, are formed on the substrate 100. The first and second fin structures 120 may extend a first direction. The first and second fin structures 120 may be partially buried in the isolation layer 110 with protruding portions above the isolation layer 110. According to some embodiments, the first and second fin structures 120 may be completely buried in the isolation layer 110. The upper surfaces of the first and second fin structures 120 and the upper surface of the isolation layer 110 may be at an equal level. In some embodiments, the upper surfaces of the first and second fin structures 120 and the upper surface of the isolation layer 110 may be at the different levels.

The first and second fin structures 120 under the gate structure 148 may provide non-planar channels. As illustrated in FIGS. 1 through 3, the gate structure 148 may have a gate-last formed structure, which may be formed using, for example, a replacement process. While illustrated as a gate-last formed structure, in some embodiments, the gate structure 148 may have a gate-first structure or other structures. The gate structure 148 may extend a second direction, which is perpendicular to the first direction.

First and second current enhancing structures 126 are formed on the first and second fin structures 120 contacting the upper surfaces of the first and second fin structures 120, respectively. The first and second current enhancing structures 126 may extend in the first direction with the first and second fin structures 120. As illustrated in FIG. 1, the widths of the first and second current enhancing structures 126 may be equal to the widths of the first and second fin structures 120. The side walls of the first and second current enhancing structures 126 may be aligned with the side walls of the first and second fin structures 120. In some embodiments, the side walls of the first and second current enhancing structures 126 may be self-aligned to the side walls of the first and second fin structures 120.

In some embodiments, as illustrated in FIG. 2, the widths of the first and second current enhancing structures 126 may be greater than the widths of the first and second fin structures 120. The side walls of the first and second current enhancing structures 126 may not be aligned with the side walls of the first and second fin structures 120.

The first and second current enhancing structures 126 may include a lower layer 122 contacting the first and second fin structures 120, respectively, and an upper layer 124 on the lower layer 122. While illustrated as a stack of two layers, the first and second current enhancing structures 126 may be a single layer or multi-layers including three or more layers.

The first and second current enhancing structures 126 may have the widths that gradually decrease from the lower surfaces to the upper surfaces of the first and second current enhancing structures 126. As appreciated by the present inventors, if the first and second current enhancing structures 126 were to have widths that increase from the lower surfaces to the upper the surfaces of the first and second current enhancing structures 126, voids may form in a contact 150 formed between the first and second current enhancing structures 126. In some embodiments, the widths of the first and second current enhancing structures 126 are constant.

A spacer 130 is formed on the side walls of the first and second current enhancing structures 126 covering an upper surface of the isolation layer 110 between the first and second current enhancing structures 126. As illustrated in FIG. 1, the spacer 130 may partially fill the gap between the first and second current enhancing structures 126 and an insulating layer 132 may be formed on the spacer 130. As illustrated in FIG. 2, in some embodiments, the spacer 130 may completely fill the gap between the first and second current enhancing structures 126. The spacer 130 may be also formed on the side walls of the gate structure 148.

A contact 150 may be formed on the first and second current enhancing structures 126 contacting the side walls of the first and second current enhancing structures 126. The contact may extend in the second direction, which is perpendicular to the first direction, and may cross over the first and second current enhancing structures 126. The lower surface of the contact 150 may contact the upper surface of the isolation layer 110. In some embodiments, the lower surface of the contact 150 may not contact the upper surface of the isolation layer 110 since the lower surface of the contact may be higher than the upper surface of the isolation layer 110.

The gate structure 148 may include a gate insulating layer 140 and a gate electrode 146 formed on the gate insulating layer 140. The gate electrode 146 may include a stack of two layers including first and second gate electrodes 142 and 144. The first gate electrode 142 may be conformally formed on the gate insulating film 140 and the second gate electrode 144 may fill the gap defined by the first gate electrode 142. In some embodiments, the gate electrode 146 may include a stack of three or more layers.

Referring to FIG. 3, a Silicon On Insulator (SOI) substrate including a substrate layer 100' and a buried insulator 112 may be used as a substrate. The first and second fin structures 120 may contact the upper surface of the buried insulator 112. The buried insulator 112 electrically isolates the first and second fin structures 120 from each other. The spacer 130 covers the upper surface of the buried insulator 112 between the first and second fin structures 120. The spacer 130 may partially or completely fill the gap between the first and second current enhancing structures 126.

FIGS. 4 through 10 and FIG. 14 are perspective views illustrating intermediate structures provided as portions of a method of fabricating a fin transistor according to some embodiments of the present inventive concept.

Figure 4:
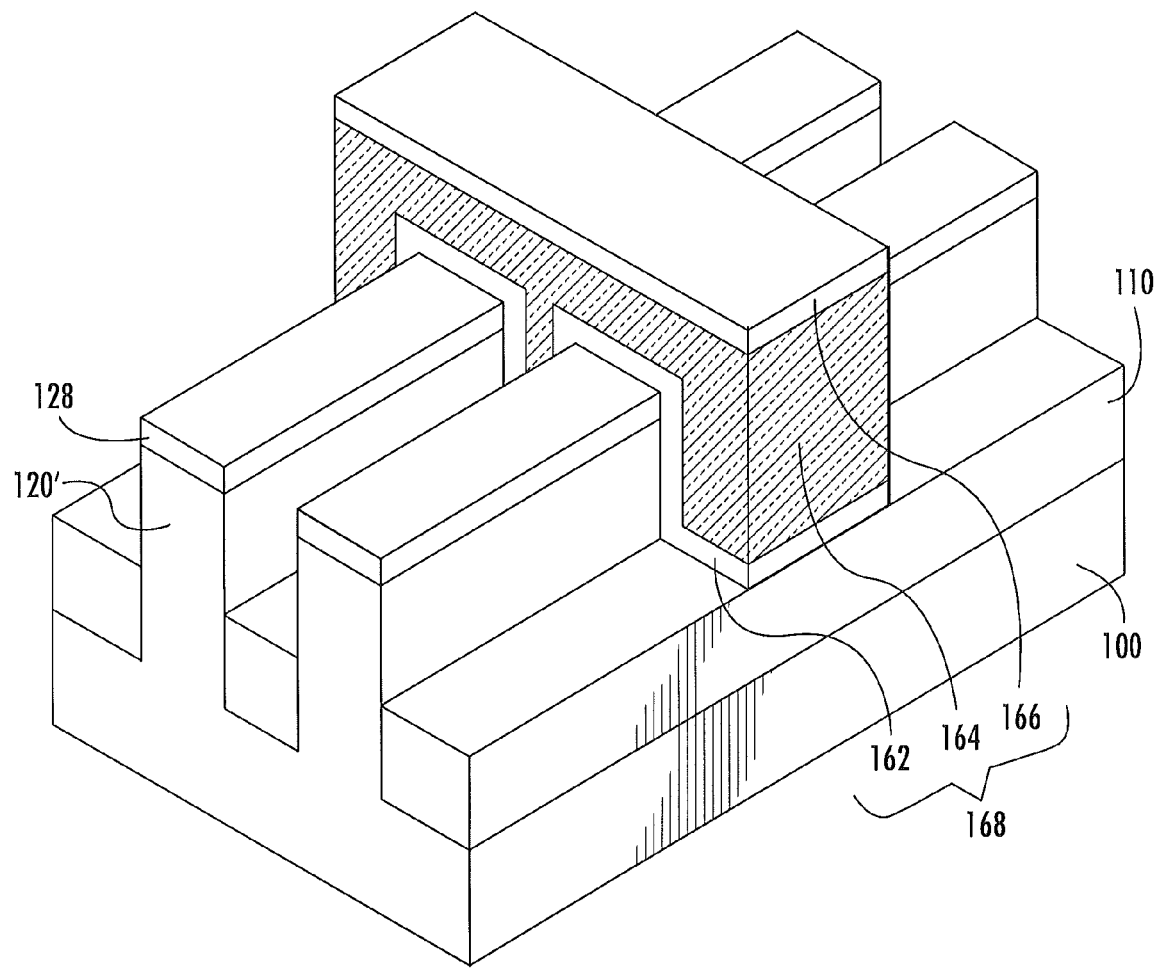
FIGS. 4 through 11 and FIG. 14 are perspective views illustrating intermediate structures provided as portions of a method of fabricating a fin transistor according to some embodiments of the present inventive concept.

Referring to FIG. 4, first and second preliminary fin structures 120', which are directly adjacent each other, are formed on the substrate 100. The isolation layer 110 is formed on the substrate 100. The first and second preliminary fin structures 120' may be partially or completely buried in the isolation layer 110. The first and second preliminary fin structures 120' may be formed by patterning the substrate using the hard mask 128. According to some embodiments, the first and second preliminary fin structures 120' may be formed by epitaxial growth from a seed layer in the substrate 100.

The substrate 100 may include one or more semiconductor materials selected from the group consisting of Si, Ge, SiGe, GaP, GaAs, SiC, SiGeC and InP. The substrate 100 may be, for example, a bulk silicon substrate or a SOI substrate. The isolation layer 110 may include an insulating material such as, for example, oxide.

The hard mask 128 may be any appropriate material, which can be used as a mask during etching the substrate 100 to form the first and second preliminary fin structures 120', such as, for example, silicon nitride. The hard mask 128 may have thickness in range of 2 to 10 nm.

After forming the first and second preliminary fin structures 120', a dummy gate structure 168 including a dummy gate insulating layer 162, a dummy gate electrode 164 and a mask pattern 166 may be formed. An etching process may be performed to form the dummy gate structure 168. The dummy gate structure 168 may extend a direction perpendicular to the direction in which the first and second preliminary fin structures 120' extend. The dummy gate insulating layer 162 may include silicon oxide, the dummy gate electrode 164 may include polysilicon, and the mask pattern 166 may include any appropriate material which can be used as a mask when etching the dummy gate insulating layer 162 and the dummy gate electrode 164.

Figure 5:
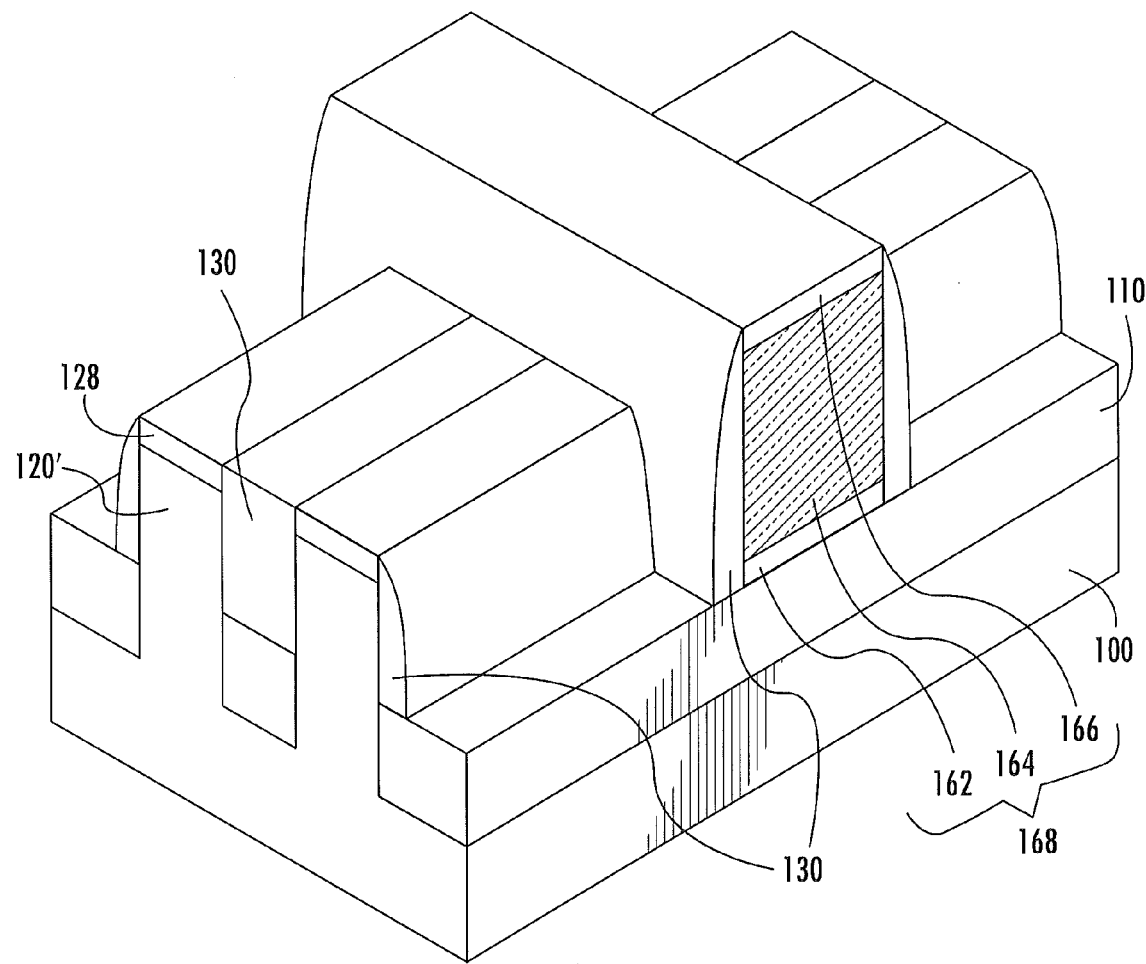

Referring to FIG. 5, a spacer 130 is formed on the side walls of the first and second preliminary fin structures 120' and the side walls of the dummy gate structure 168. The spacer 130 may be provided by forming a spacer layer on the structure illustrated in FIG. 4 and then performing an etch-back process. The etch-back process may partially remove the spacer layer to form the spacer 130. The spacer 130 may include silicon nitride, aluminum nitride, silicon oxynitride or silicon carbide.

The spacer 130 may expose the upper surfaces of the hard mask 128 and the mask pattern 166. The top surface of the spacer 130 may be at a level that is equal to the upper surface of the hard mask 128 such that the top surface of the spacer 130 is higher than the upper surfaces of the first and second preliminary fin structures 120' with respect to the upper surface of the isolation layer 110. In some embodiments, the top surface of the spacer 130 may be lower than the upper surface of the hard mask 128 with respect to the upper surface of the isolation layer 110.

The spacer 130 formed on the side walls of the first and second preliminary fin structures 120' covers the upper surface of the isolation layer 110 between the first and second preliminary fin structures 120'. In some embodiments, the spacer 130 may completely fill the gap between the first and second preliminary fin structures 120'. In some embodiments, the spacer 130 may partially fill the gap between the first and second preliminary fin structures 120'. The thickness of the spacer 130 may be varied according to the distance between the first and second preliminary fin structures 120' such that the spacer 130 covers the upper surface of the isolation layer 110 between the first and second preliminary fin structures 120'.

Figure 6:
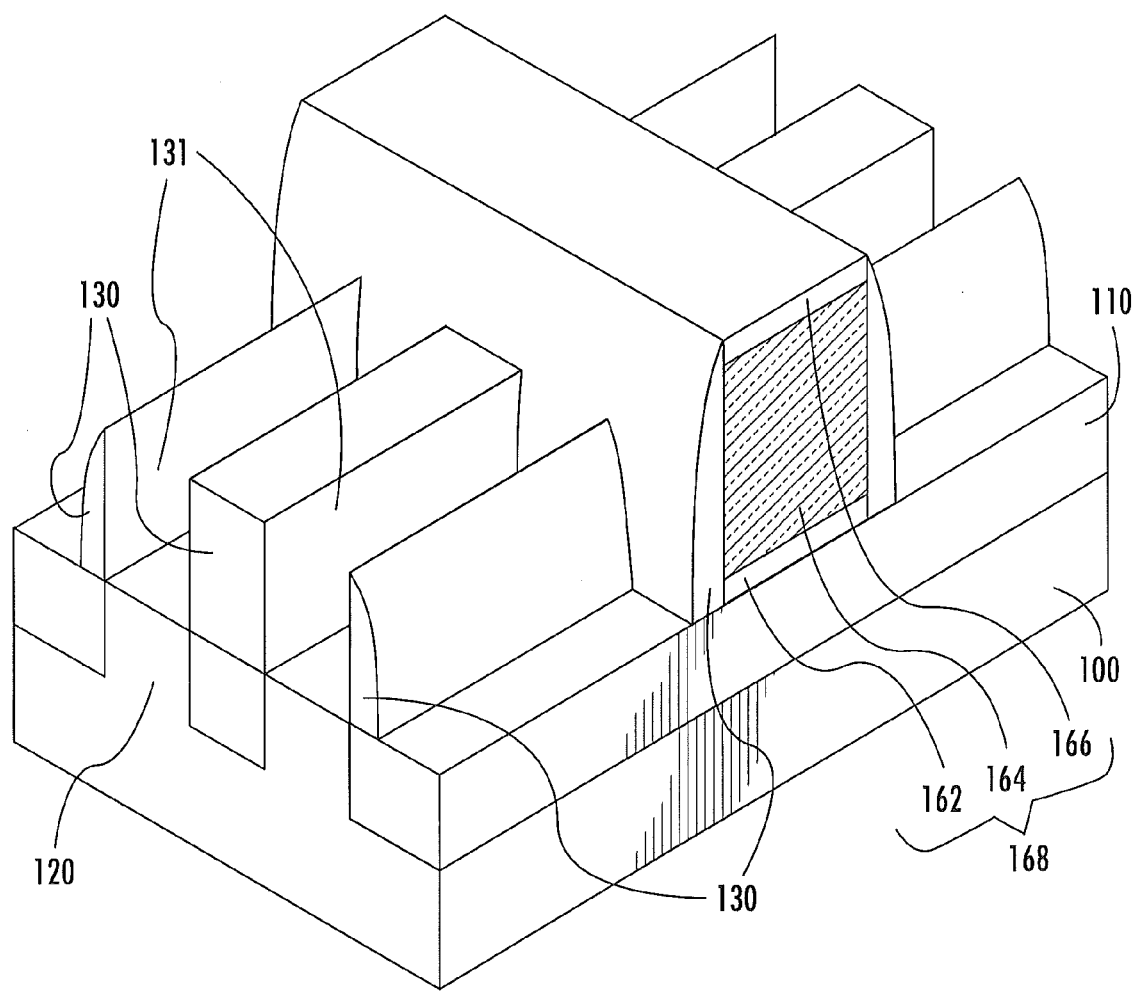

Referring to FIG. 6, upper portions of the first and second preliminary fin structures 120' are selectively removed to form the first and second fin structures 120 and to expose the side walls of the spacer 130 in the first and second recesses 131. The upper portions of the first and second preliminary fin structures 120' may be removed by any appropriate etch process, wet and/or dry etch process, which can selectively etch the first and second preliminary fin structures 120' relative to the spacer 130. The upper surfaces of the first and second fin structures 120 may be at an equal level to the upper surface of the isolation layer 110. In some embodiments, the upper surfaces of the first and second fin structures 120 may be at a different level from the upper surface of the isolation layer 110. For example, the upper surfaces of the first and second fin structures 120 may be higher than the upper surface of the isolation layer 110.

Portions of the first and second preliminary fin structures 120' under the dummy gate structure 168 may not be etched while removing the upper portions of the first and second preliminary fin structures 120' and may provide non-planar channels.

Portions of the side walls of the spacer 130 may be removed after removing the upper portions of the first and second preliminary fin structures 120' to increase the widths of the first and second recesses 131 to greater than that of the first and second fin structures 120 as illustrated in FIG. 2.

Figure 7:
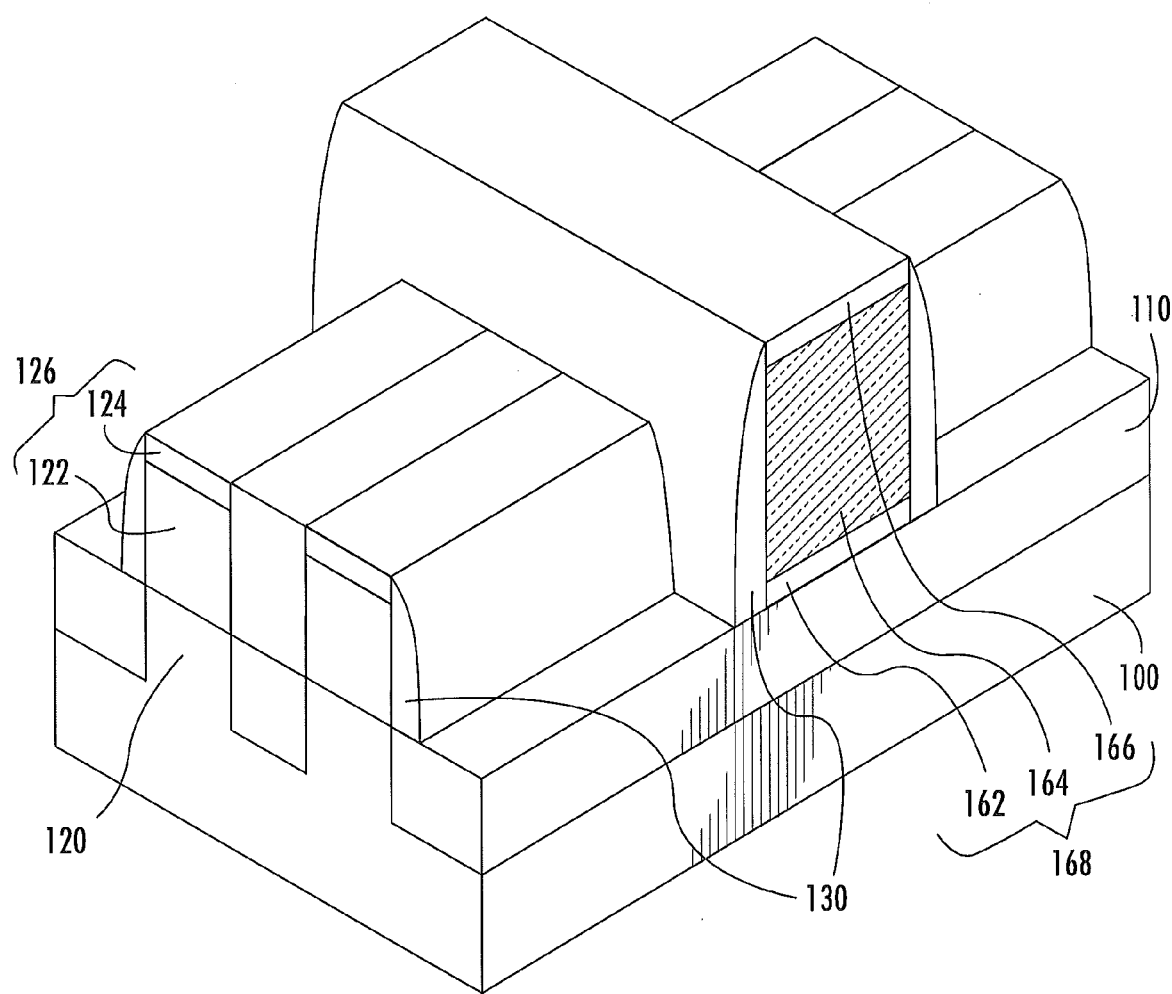

Referring to the FIG. 7, the first and second current enhancing structures 126, which contact the first and second fin structures 120, respectively, are formed in the first and second recesses 131. The first and second current enhancing structures 126 may be formed in the first and second recesses 131 while being constrained by the side walls of the spacer 130. The first and second current enhancing structures 126 may not merge with one another since the spacer 130 confines the first and second current enhancing structures 126 to the first and second recesses 131, so that the first and second current enhancing structures 126 do not extend outward toward each other.

The top surfaces of the first and second current enhancing structures 126 may be at an equal level to the top surface of the spacer 130. In some embodiments, the top surfaces of the first and second current enhancing structures 126 may be at a different level from the top surface of the spacer 130.

The first and second current enhancing structures 126 may include a lower layer 122 contacting the first and second fin structures 120 and an upper layer 124. The upper layer 124 may include a material which can be used as an etch mask during subsequent etching processes. While illustrated as a stack of two layers, the first and second current enhancing structures 126 may be a single layer or multi-layers including more than two layers.

In some embodiments, the lower layer 122 may include a material having a resistivity less than a resistivity of a material included in the first and second fin structures 120 to reduce parasitic source-drain resistance. Reduced parasitic source-drain resistance may increase the current carried by the device. The lower layer 122 may include, for example, doped Si, SiGe, or SiC.

According to some embodiments, the lower layer 122 may include a stressor material, which increases channel mobility and thus may increase the current. Appropriate stress applied to a channel such as, for example, by different lattice constants may improve the mobility of carriers and increase the amount of current. For example, a stressor material having a greater lattice constant than the substrate in a P-type transistor such as, for example, SiGe may apply compressive stress to the channel of the P-type transistor and thus increase the current. A stressor material having a lattice constant that is less than that of the substrate in an N-type transistor such as, for example SiC, may apply tensile stress to the channel of the N-type transistor and thus increase the current.

The lower layer 122 may include a SiGe layer as a stressor material. The SiGe layer may have a lattice constant greater than a lattice constant of a material comprising the first and second fin structures 120. The SiGe layer may be epitaxially grown on the first and second fin structures 120 in the recess 131.

The epitaxially grown SiGe layer can be formed in the recesses 131 by supplying a silicon-containing gas such as, for example, silane, and a germanium-containing gas such as, for example, germane. The components of the gas can be energized to form the SiGe layer by providing sufficient thermal energy for the reaction to occur such as, for example, by heating the substrate 100 to a sufficiently high temperature.

The upper layer 124 may be a hard mask. The upper layer 124 may be deposited or epitaxially grown on the lower layer 122 in the recess 131. Where the lower layer 122 includes a stressor material, the upper layer 124 may be epitaxially grown on the lower layer 122 by changing a concentration of a constituent included in the stressor material in the lower layer 122 at the appropriate time during the deposition. For example, where the lower layer 122 includes a SiGe layer, the upper layer 124 may include a SiGe layer having less Ge concentration compared with the SiGe layer in the lower layer 122.

Figure 8:
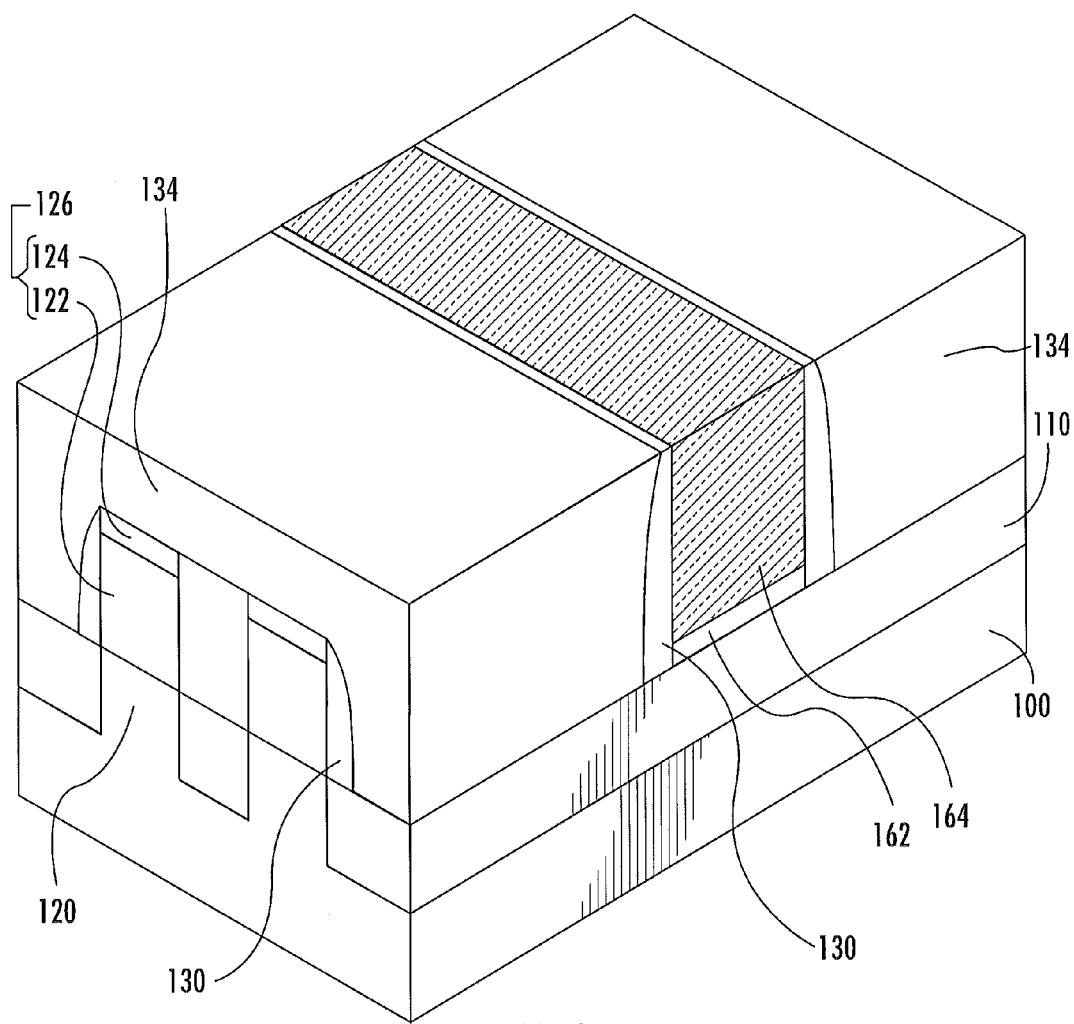

Referring to FIG. 8, a first interlayer insulating layer 134 may be formed on the structure illustrated in FIG. 7. The first interlayer insulating layer 134 may formed by depositing and planarizing an insulating layer. The mask pattern 166 may be removed during planarizing the insulating layer. In some embodiments, the mask pattern 166 may be removed by an etching process after the planarizing process. The first interlayer insulating layer 134 may expose the top surface of the dummy gate electrode 164.

Figure 9:
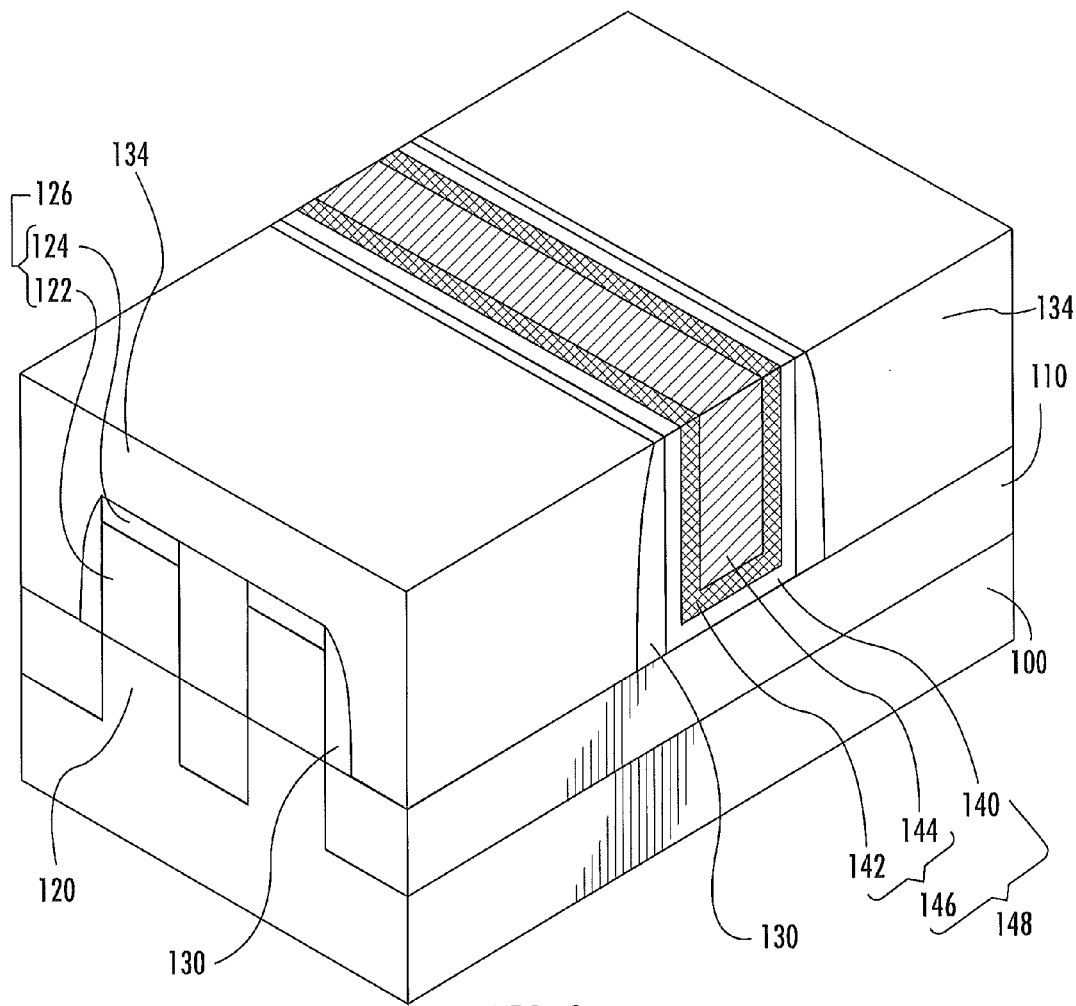

Referring to FIG. 9, the dummy gate insulating layer 162 and the dummy gate electrode 164 may be replaced with the gate structure 148 including the gate insulating layer 140 and the gate electrode 146. The dummy gate insulating layer 162 and the dummy gate electrode 164 may be removed by any appropriate etching process, wet and/or dry etch process, to form a trench defined by the side walls of the spacer 130. Then the gate insulating layer 140 and the gate electrode 146 may be formed in the trench.

The gate insulating layer 140 may include a dielectric material such as, for example, silicon dioxide. In some embodiments, the gate insulating layer 140 may include a high-k material having a higher dielectric constant than a silicon oxide film such as, for example, hafnium oxide (HfO2), lanthanum oxide, (La2O3), zirconium oxide, (ZrO2), and tantalum oxide (Ta2O5). The gate insulating layer 140 may be conformally formed on the side walls and the bottom surface of the trench by, for example, atomic layer deposition (ALD).

The gate electrode 146 may include the first and second gate electrodes 142 and 144. The first gate electrode 142 may be conformally formed on the gate insulating layer 140 and the second gate electrode 144 may fill a space formed by the first gate electrode 142. The first gate electrode 142 may include one of TiN, TaN, TiC and TaC. The second electrode 144 may include W or Al. Alternatively, the gate electrode 146 may include semiconductor materials such as, for example, Si and SiGe.

Figure 10:
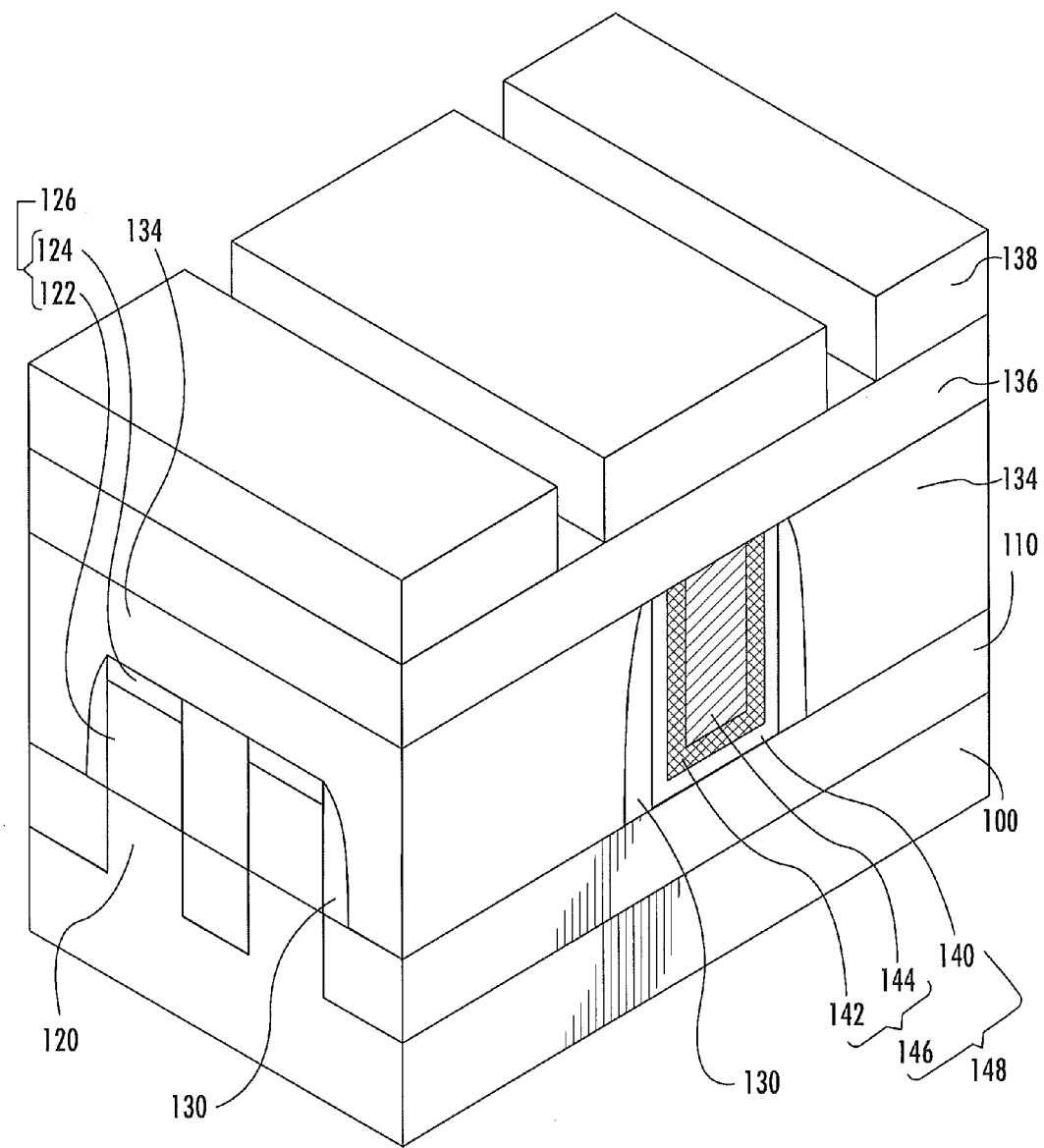

Referring to FIG. 10, a second interlayer insulating layer 136 may be formed on the first interlayer insulating layer 134 and the gate structure 148. The contact pattern 138 may be formed on the second interlayer insulating layer 136. The contact pattern 138 may include trenches exposing the upper surface of the second interlayer insulating layer 136. The contact pattern 138 may include a photoresist, a hard material or combination thereof.

Figure 11:
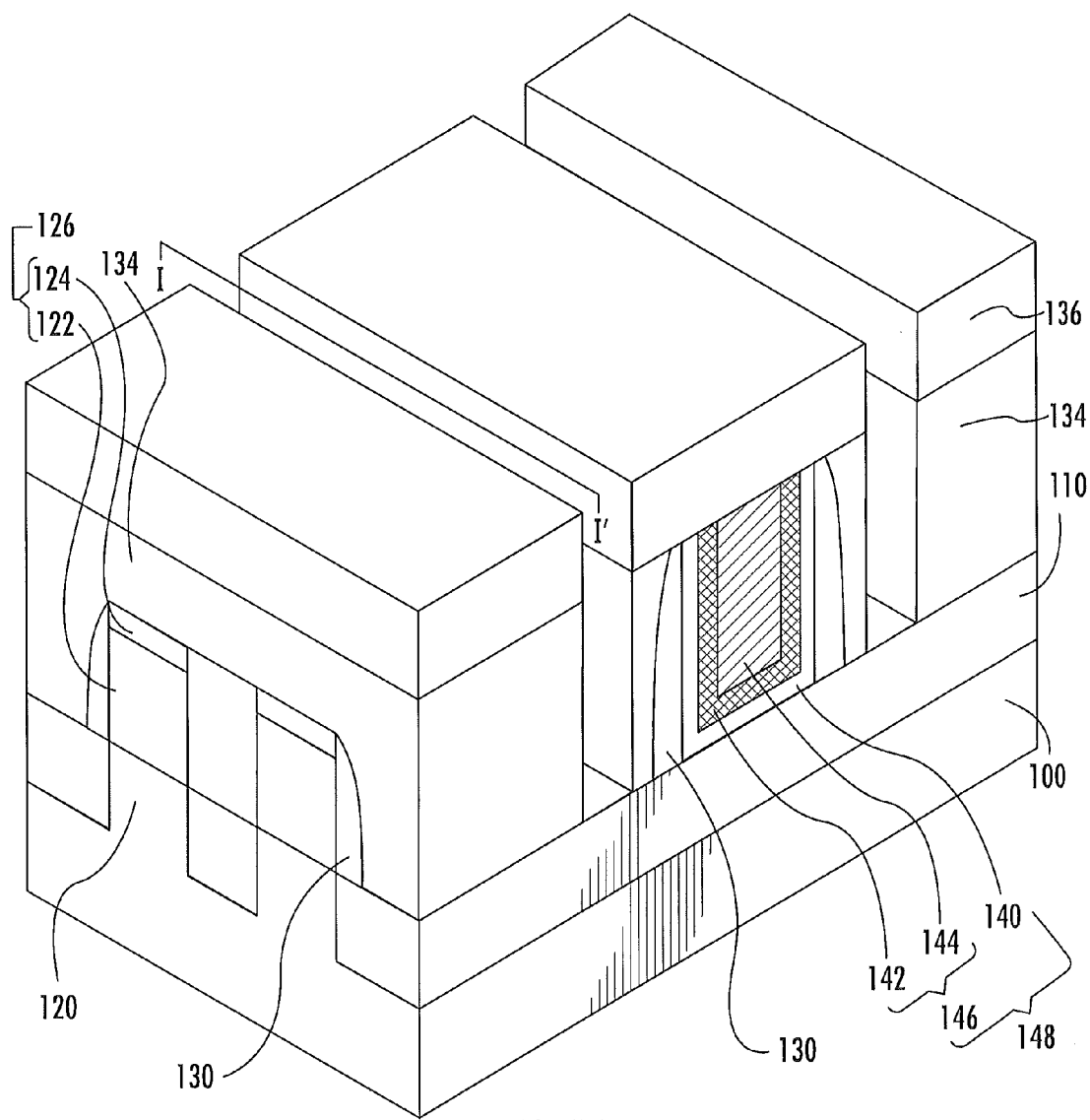

Referring to FIG. 11, the first and second interlayer insulating layers 134, 136 may be etched using the contact pattern 138. If the spacer 130 completely fills the gap between the first and second current enhancing structures 126, the first and second interlayer insulating layers 134, 136 may be etched until exposing the first and second current enhancing structures 126 and the spacer 130, which are used as an etch stop layer. The first and second interlayer insulating layers 134, 136 may have an etch selectivity with respect to the spacer 130 of about 10:1. Where the insulating layer 132 is formed on the spacer 130 between the first and second current enhancing structures 126 as illustrated in FIG. 1, the first and second interlayer insulating layers 134, 136 may be etched until exposing the first and second current enhancing structures 126 and the insulating layer 132, which are used as an etch stop layer.

Figure 12:
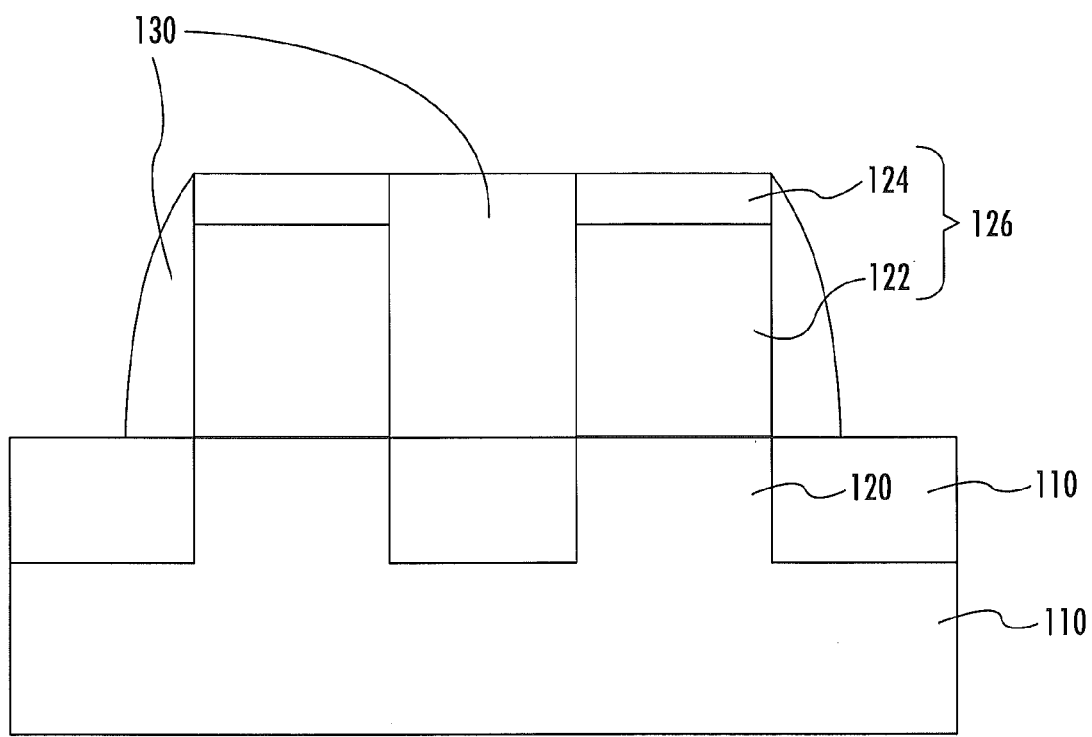
FIGS. 12, 13 and 15 are cross-sectional views illustrating intermediate structures provided as portions of a method of fabricating a fin transistor according to some embodiments of the present inventive concept.

FIG. 12 is a cross-sectional view taken along the line I-I' of FIG. 11. The first and second interlayer insulating layers 134, 136 may be removed to expose the upper surface of the isolation layer 110. According to some embodiments, portions of the first and second interlayer insulating layers 134, 136 may remain above the upper surface of the isolation layer 110. Since the upper surface of the isolation layer 110 between the first and second current enhancing structures 126 is covered by the spacer 130, the isolation layer 110 between the first and second current enhancing structures 126 may not be etched during etching the first and second interlayer insulating layers 134, 136. In some embodiments, a reactive ion etch may be used to etch the first and second interlayer insulating layers 134, 136 and a Si3N4 layer can be used as the spacer 130. The Si3N4 layer covering the isolation layer 110 may have a thickness in range of about 10 to 15 nm to be used as an etch stop layer.

Figure 13:
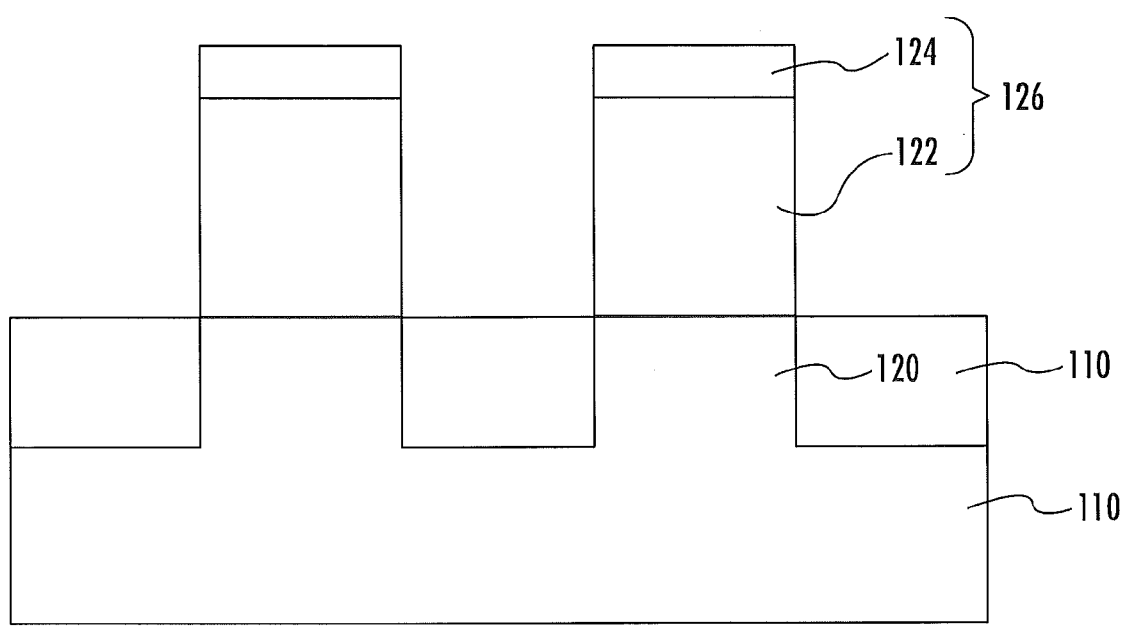

FIG. 13 illustrates the structure after portions of the spacer 130 exposed by the first and second interlayer insulating layers 134, 136 are removed from the structure illustrated in FIG. 12. Any appropriate etch process, wet and/or dry etch process, may be used to remove the portions of the spacer 130. The side walls of the first and second current enhancing structures 126 may be exposed by removing the portions of the spacer 130. The side walls of the first and second current enhancing structures 126 may be completely exposed as illustrated in FIG. 13. In some embodiments, the side walls of the first and second current enhancing structures 126 may be partially exposed.

Figure 14:
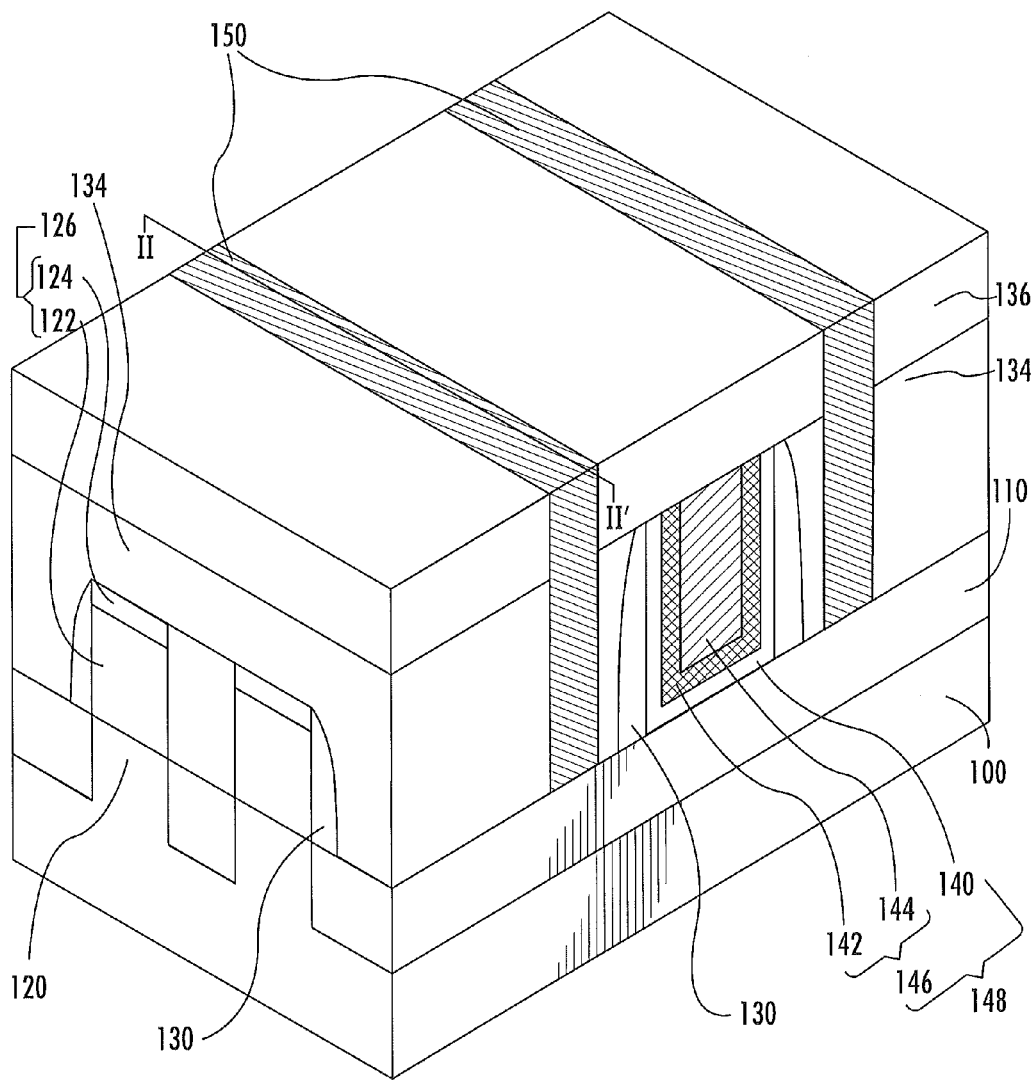
Figure 15:
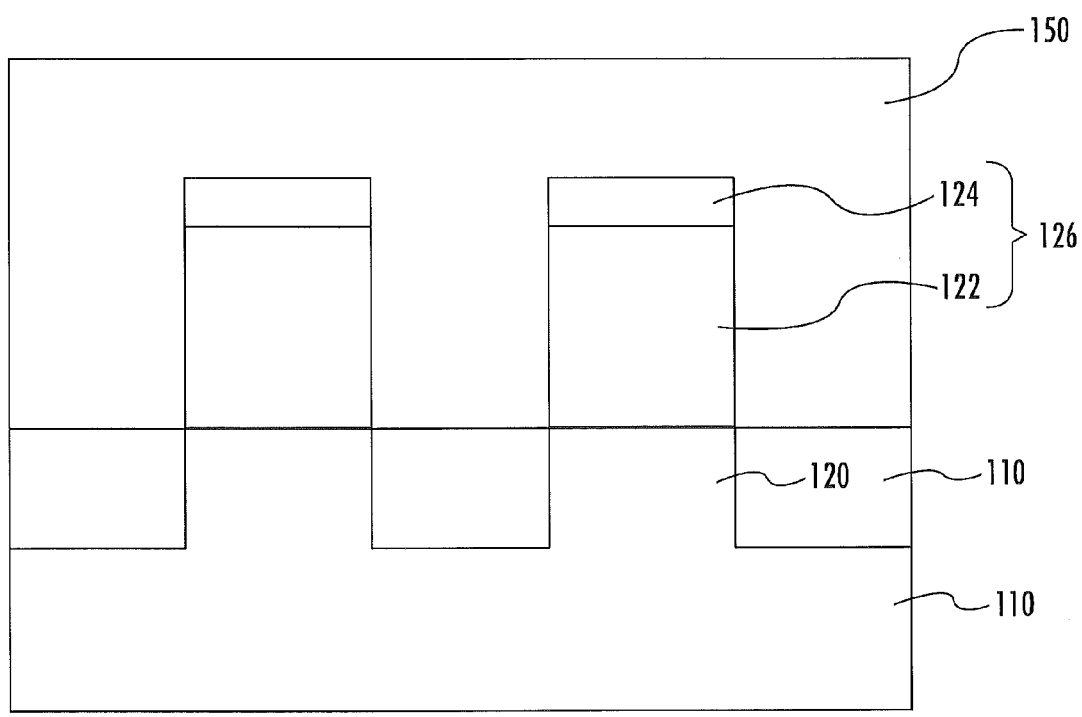

Referring to FIG. 14, the contact 150 may be formed in the first and second interlayer insulating layers 134, 136 after removing the portions of the spacer 130. FIG. 15 is a cross-sectional view taken along the line II-IP of FIG. 14. The contact 150 may contact the side walls of the first and second current enhancing structures 126. The contact 150 may include conductive materials such as tungsten, aluminum, and copper. The contact 150 may include a metal-insulator-silicon structure to reduce silicidation of the first and second fin structures 126. The contact 150 may include two or more layers.

Figure 16:
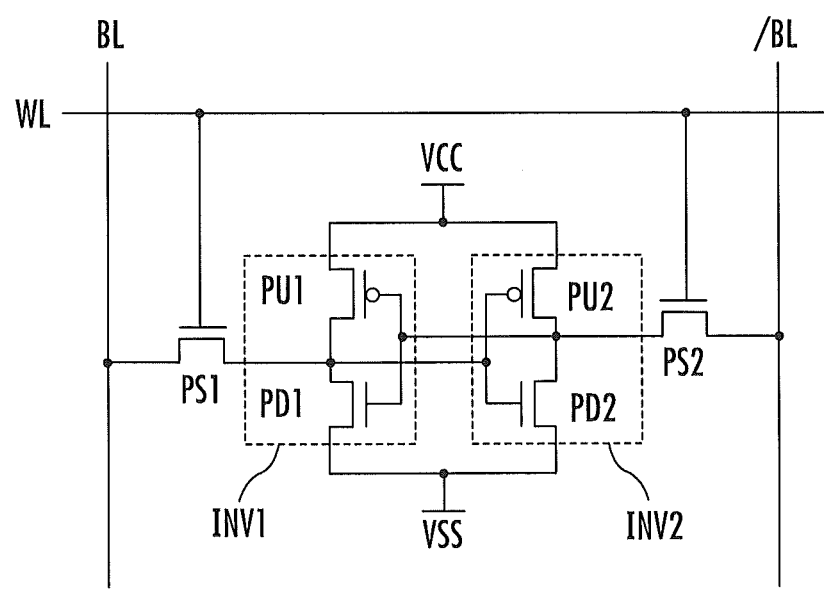
FIG. 16 is a circuit diagram of a Static Random Access Memory (SRAM) according to some embodiments of the present inventive concept.

FIG. 16 is a circuit diagram of a SRAM according to some embodiments of the present inventive concept. While the semiconductor devices according to some embodiments of the present inventive concept are applicable to all structures or devices, a SRAM is illustrated as an example. Since according to some embodiments the first and second current enhancing structures 126 may be confined in the spacer 130, some embodiments may result in smaller SRAM cell size.

The SRAM may include a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line /BL, respectively. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors.

In addition, in order to a constitute a latch circuit by the first inverter INV1 and the second inverter INV2, an input node of the first inverter INV 1 is connected to an output node of the second inverter INV2, and an input node of the second inverter INV2 is connected to an output node of the first inverter INV 1.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor structure in a finFET, the method comprising:
   forming first and second fin structures directly adjacent each other overlying a substrate including an isolation layer, wherein the first and second fin structures contact the isolation layer;
   forming a spacer defining first and second recesses therein on the isolation layer, wherein uppermost surfaces of the first and second fin structures define respective lowermost surfaces of the first and second recesses, and the spacer covers an upper surface of the isolation layer between the first and second recesses; and
   forming first and second current enhancing structures contacting the first and second fin structures, respectively, in the first and second recesses.

2. The method of claim 1 further comprising:
   removing portions of side walls of the spacer to increases widths of the first and second recesses to greater than those of the first and second fin structures respectively.

3. The method of claim 1 wherein forming the first and second fin structures comprises:
   forming first and second preliminary fin structures directly adjacent each other overlying the substrate, wherein the first and second preliminary fin structures contact the isolation layer;
   forming a spacer layer on the isolation layer and on side walls of the first and second preliminary fin structures to fill a gap therebetween; and
   removing upper portions of the first and second preliminary fin structures to form the first and second fin structure respectively and to expose side walls of the spacer in the first and second recesses.

4. The method of claim 3 further comprising:
   removing portions of the side walls of the spacer to increases widths of the first and second recesses to greater than those of the first and second fin structures respectively.

5. The method of claim 3 further comprising:
   partially etching the spacer layer before forming the first and second recesses.

6. The method of claim 1, wherein forming the first and second fin structures comprises forming the first and second fin structures at least partially buried in the isolation layer.

7. The method of claim 1, wherein forming the first and second fin structures comprises forming the first and second fin structures contacting an upper surface of the isolation layer.

8. The method of claim 7, wherein the substrate comprises a Silicon On Insulator (SOI) and the isolation layer comprises a buried insulator of the SOI.

9. The method of claim 1 further comprising:
   forming a gate structure crossing over and contacting the first and second fin structures; and
   forming the spacer on side walls of the gate structure while forming the spacer on the isolation layer.

10. The method of claim 1 wherein the spacer completely covers the upper surface of the isolation layer between the first and second recesses.

11. The method of claim 1 wherein forming the first and second current enhancing structures comprises forming the first and second current enhancing structures comprising a material having a resistivity less than a resistivity of a material comprising the first and second fin structures.

12. The method of claim 1 wherein forming the first and second current enhancing structures comprises forming the first and second current enhancing structures comprising a stressor material, which contact the first and second fin structures.

13. The method of claim 12 wherein forming the first and second current enhancing structures comprising the stressor material comprises epitaxially growing the stressor material in the first and second recesses while being constrained by the spacer.

14. The method of claim 13 wherein forming the first and second current enhancing structures further comprises forming a hard mask material on the stressor material.

15. The method of claim 14 wherein forming the hard mask material comprises epitaxially growing the hard mask material while changing a concentration of a constituent comprising the stressor material, wherein the hard mask material contacts an uppermost surface of the stressor material.

16. The method of claim 12 wherein forming the first and second current enhancing structures comprising the stressor material comprises forming the stressor material having a lattice constant greater than a lattice constant of a material comprising the first and second fin structures.

17. The method of claim 1 further comprising:
   forming an interlayer insulating layer on the spacer and the first and second current enhancing structures;
   forming a contact pattern on the interlayer insulating layer; and
   etching the interlayer insulating layer using the contact pattern until reaching the first and second current enhancing structures.

18. The method of claim 17 further comprising:
   then removing the spacer to expose side walls of the first and second current enhancing structures; and
   forming a contact on the first and second enhancing structures contacting the side walls of the first and second enhancing structures.

19. A method of forming a semiconductor structure in a finFET, the method comprising:

forming first and second fin structures directly adjacent each other overlying a substrate including an isolation layer, wherein the first and second fin structures contact the isolation layer;

forming a spacer including first and second recesses exposing upper surfaces of the first and second fin structures respectively on the isolation layer, wherein the spacer covers an upper surface of the isolation layer between the first and second recesses; and forming first and second current enhancing structures contacting the first and second fin structures, respectively, in the first and second recesses, wherein the first and second current enhancing structures comprise a material having a resistivity less than a resistivity of a material comprising the first and second fin structures.

20. A method of forming a semiconductor structure in a finFET, the method comprising:

forming first and second fin structures directly adjacent each other overlying a substrate including an isolation layer, wherein the first and second fin structures contact the isolation layer;

forming a spacer including first and second recesses exposing upper surfaces of the first and second fin structures respectively on the isolation layer, wherein the spacer covers an upper surface of the isolation layer between the first and second recesses; and forming first and second current enhancing structures contacting the first and second fin structures, respectively, in the first and second recesses, wherein the first and second current enhancing structures comprise a stressor material, which contact the first and second fin structures.

* * * * *